(12) United States Patent
Hsu et al.

(10) Patent No.: US 8,071,890 B2
(45) Date of Patent: Dec. 6, 2011

(54) ELECTRICALLY CONDUCTIVE STRUCTURE OF CIRCUIT BOARD AND CIRCUIT BOARD USING THE SAME

(75) Inventors: Chien-Min Hsu, Kaohsiung (TW); Shih-Hsien Wu, Yangmei Township, Taoyuan County (TW); Shinn-Juh Lai, Jhudong Township, Hsinchu County (TW); Min-Lin Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 727 days.

(21) Appl. No.: 12/181,330

(22) Filed: Jul. 29, 2008

(65) Prior Publication Data

US 2009/0107717 A1 Apr. 30, 2009

(30) Foreign Application Priority Data

Oct. 26, 2007 (TW) ................................ 96140424 A

(51) Int. Cl.
*H05K 1/16* (2006.01)
(52) U.S. Cl. ........ 174/262; 174/260; 361/761; 361/763; 361/778; 361/780
(58) Field of Classification Search .......... 174/261–262; 361/761, 763, 766, 775, 777–778, 780, 782
See application file for complete search history.

(56) References Cited

U.S. PATENT DOCUMENTS

| | | | |
|---|---|---|---|
| 3,757,028 A * | 9/1973 | Schlessel | 174/33 |
| 5,039,824 A * | 8/1991 | Takashima et al. | 174/33 |
| 5,079,069 A * | 1/1992 | Howard et al. | 428/209 |
| 5,161,086 A | 11/1992 | Howard et al. | |
| 5,646,368 A * | 7/1997 | Muyshondt et al. | 174/33 |
| 5,909,350 A * | 6/1999 | Anthony | 361/118 |
| 6,300,846 B1 * | 10/2001 | Brunker | 333/1 |
| 6,396,000 B1 * | 5/2002 | Baum | 174/261 |
| 6,556,420 B1 * | 4/2003 | Naito et al. | 361/306.1 |
| 6,678,145 B2 | 1/2004 | Naito et al. | |
| 7,215,531 B2 * | 5/2007 | Naito et al. | 361/306.1 |
| 7,227,200 B2 * | 6/2007 | Jin | 257/203 |
| 7,423,884 B2 * | 9/2008 | Enchi et al. | 361/761 |
| 7,528,433 B2 * | 5/2009 | Jow et al. | 257/307 |
| 7,649,748 B2 * | 1/2010 | Kariya et al. | 361/782 |
| 7,742,276 B2 * | 6/2010 | Hsu et al. | 361/306.2 |
| 7,881,040 B2 * | 2/2011 | Togashi | 361/302 |

FOREIGN PATENT DOCUMENTS

TW 279901 B 4/2007

* cited by examiner

*Primary Examiner* — Robert J Hoffberg
(74) *Attorney, Agent, or Firm* — Rabin & Berdo, P.C.

(57) ABSTRACT

An electrically conductive structure includes a first conductive structure and a second conductive structure. Each has a conducting section at one end and a coupling section at the other end. The first and second conducting sections are electrically connected to a power and ground contact of an electronic device, respectively. The first and second coupling sections are respectively connected with power and ground layer of a circuit board. The first coupling sections are connected with the first conducting section through first extending sections and the second coupling sections are connected with the second conducting section through second extending sections. At least two coupling sections of the conductive structures are arranged in pairs. The first conductive structure and the second conductive structure are arranged in a staggered array to form two wiring loops having opposite current directions, thereby generating a magnetic flux cancellation effect.

22 Claims, 13 Drawing Sheets

ELECTRICALLY CONDUCTIVE STRUCTURE OF CIRCUIT BOARD AND CIRCUIT BOARD USING THE SAME

CROSS-REFERENCE TO RELATED APPLICATIONS

This non-provisional application claims priority under 35 U.S.C. §119(a) on Patent Application No(s). 096140424 filed in Taiwan, R.O.C. on Oct. 26, 2007 the entire contents of which are hereby incorporated by reference.

BACKGROUND OF THE INVENTION

1. Field of Invention

The present invention relates to an electrically conductive structure of a circuit board, and more particularly to a metal conductive structure disposed in a circuit board for electrically connecting a contact of an electronic device on the circuit board to a power layer and a ground layer of the circuit board. The discrete capacitor may be embedded in the circuit board.

2. Related Art

Usually, an electronic device is disposed on a printed circuit board (PCB) or an IC substrate (hereinafter a circuit board is taken as an example, but the present invention is not limited to the circuit board). The specific contact of the electronic device is electrically connected to a power plane (also referred to as a power layer) and a ground plane (also referred to as a ground layer) in the circuit board through a metal conductive structure in the circuit board, such that the electronic device may receives the power from the circuit board to operate.

With the improvement of the semi-conductor's process technology, the operation speed of the electronic device disposed on the circuit board may be increased quickly, and the switching speed of signals may be also increased. Consequently, the power supply from the circuit board cannot provide a stable power at such a high switching speed, resulting in an unsatisfactory operation of the electronic device. Moreover, a power noise or ground bounce may be induced in the power delivery systems. In order to deal with this problem, persons skilled in the art dispose a decoupling capacitor or a bypass capacitor on the circuit board at the position close to the power/ground pins of the electronic devices. The decoupling/bypass capacitor may be an SMD capacitor or an embedded multilayer planar capacitor. By using of the above skills, the decoupling capacitors provide a localized source of DC power for electronic devices when the signals of electronic devices switch simultaneously. Therefore, the decoupling capacitors may supply energies of power in time when the energies of power is insufficient at a high-frequency operation, thereby absorbing glitch, reducing RF (Radio Frequency) noise and stabilizing the voltage levels.

The similar technique is disclosed in U.S. Pat. No. 5,161, 086 entitled "Capacitor laminate for use in capacitive printed circuit boards and methods of manufacture." Referring to FIG. 1, an electronic device 102 (surface mounted device) is disposed on the surface of the circuit board 100. The electronic device is electrically connected to the power layer and the ground layer in the circuit board through a power wire 104 and a ground wire 106. A planar capacitor 108 is connected between the power wire 104 and the ground wire 106, thereby providing a bypass function of a power system of a surface mount electronic device. Although the structure may achieve the object, an equivalent series inductance (ESL) may be formed between the metal conductive structures (i.e., the power wire 104 and the ground wire 106) when operating at a high frequency. Thus, under this design, the operation frequency is higher than the self-resonant frequency of the capacitor, the parasitic inductance of the planar capacitor and the metal conductive paths will increase, resulting in the impedance also increasing rapidly (which will be illustrated hereinafter).

A method directed to reducing the ESL effect is disclosed in the U.S. Pat. No. 6,678,145 entitled "Wiring connection structure of laminated capacitor and decoupling capacitor, and wiring board". Referring to FIG. 2, a planar capacitor 120 having a low ESL value is used as a decoupling capacitor on the power supply circuit of a chip 122. In this structure, a plurality of ground via-holes 124 and a plurality of power via-holes 126 (also referred to as feedthrough conductors) are respectively connected to a first-layer inner pole and a second-layer inner pole of the embedded capacitor 120. The feedthrough conductors connected to the first-layer pole and the second-layer pole are adjacently placed so as to depress the magnetic flux produced by the current loops with the opposite directions. Although the patent may reduce the ESL, the ESL 128 of the feedthrough conductors marked at the metal conductive structure in the drawing cannot be reduced effectively.

In the power delivery system of the electronic circuit, the capacitor having the decoupling function includes not only the planar capacitor embedded in the circuit board, but also a surface mount device (SMD) capacitor. However, since the embedded planar capacitor is closer to the power and ground pins of the electronic device as compared with the SMD capacitor welded on the surface of the PCB or the IC substrate, the parasitic inductance produced on the power transmission path of the embedded capacitor at a high speed of signal switching is lower than that produced by the SMD capacitor. That is, the decoupling effect of the embedded planar capacitor is better. But, similar to the common capacitor, along with the increasing signal switching speed of the electronic device of the planar capacitor, the parasitic inductance increases, resulting in degenerating the decoupling effect of the decoupling capacitor that is originally provided on the low-impedance path to depress the high-frequency undesired noises.

SUMMARY OF THE INVENTION

Therefore, it is an urgent and bottleneck problem in need of a solution to reduce the impedance of the decoupling capacitor, as the operation frequency is higher than the self-resonant frequency, and increase the low impedance bandwidth of the decoupling capacitor so as to effectively reduce the simultaneous switching noises with the increase of the signal switching speed.

In view of the above problems, the present invention provides an electrically conductive structure of a circuit board. The electrically conductive structure electrically couples at least one power contact and at least one ground contact of an electronic device to a power plane and a ground plane of the circuit board respectively. The electrically conductive structure includes at least one first conductive structure and at least one second conductive structure. The first conductive structure has at least one first conducting section electrically connected to the power contact at one end, and a plurality of first coupling sections electrically connected to the first conducting section at the other end. At least two first coupling sections are arranged in pairs, and the first coupling sections are electrically connected to the power plane. The second conductive structure has at least one second conducting section electrically connected to the ground contact at one end, and a plurality of second coupling sections electrically connected to the second conducting section at the other end. At least two second coupling sections are arranged in pairs, the second coupling sections are electrically connected to the ground plane. The second coupling sections in pairs and the first coupling sections in pairs are arranged in a staggered array.

The present invention further provides a circuit board having the electrically conductive structure. One electronic device is disposed on the circuit board. The electronic device has at least one power contact and at least one ground contact. The circuit board includes a power plane, a ground plane, at least one first conductive structure, and at least one second conductive structure. The first conductive structure has at least one first conducting section electrically connected to the power contact at one end, and a plurality of first coupling sections electrically connected to the first conducting section at the other end. At least two first coupling sections are arranged in pairs, and the first coupling sections are electrically connected to the power plane. The second conductive structure has at least one second conducting section electrically connected to the ground contact at one end, and a plurality of second coupling sections electrically connected to the second conducting section at the other end. At least two second coupling sections are arranged in pairs, and the second coupling sections are electrically connected to the ground plane. The second coupling sections in pairs and the first coupling sections in pairs are arranged in a staggered array.

With the above electrically conductive structure, two adjacent loops having opposite current directions are arranged between the first coupling section and the second coupling section arranged in a staggered array. Therefore, the magnetic flux between the two loops may be cancelled due to the opposite directions of current, such that the high-frequency parasitic inductance of the multilayer planar capacitor is reduced. When applied to the planar capacitor embedded in the PCBs, the decoupling bandwidth may be increased, thereby providing a stable power supply system for the high-speed electronic device.

Further scope of applicability of the present invention will become apparent from the detailed description given hereinafter.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 5:
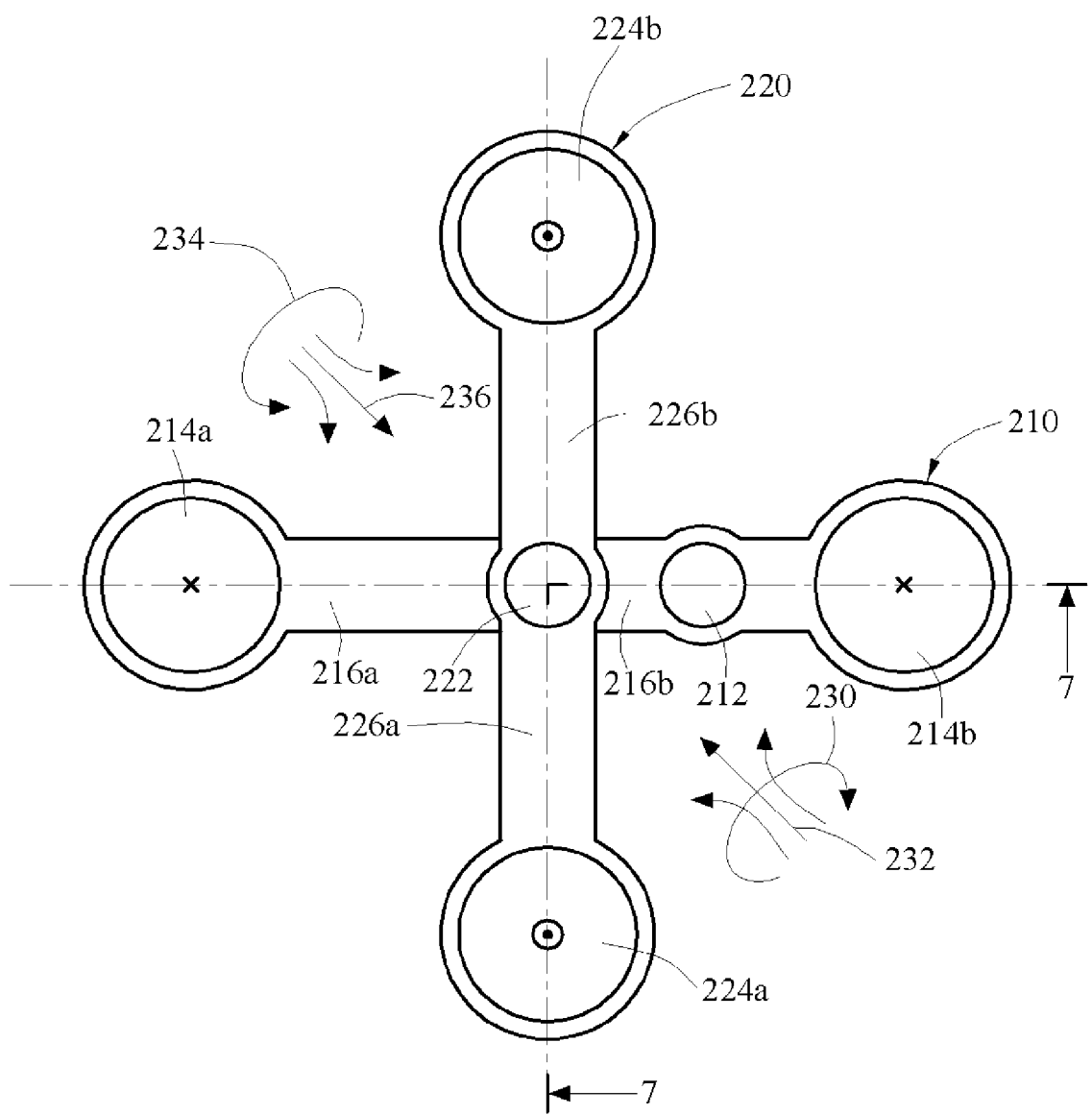
FIG. 5 is a top view of an electrically conductive structure according to a first embodiment of the present invention.
Figure 6:
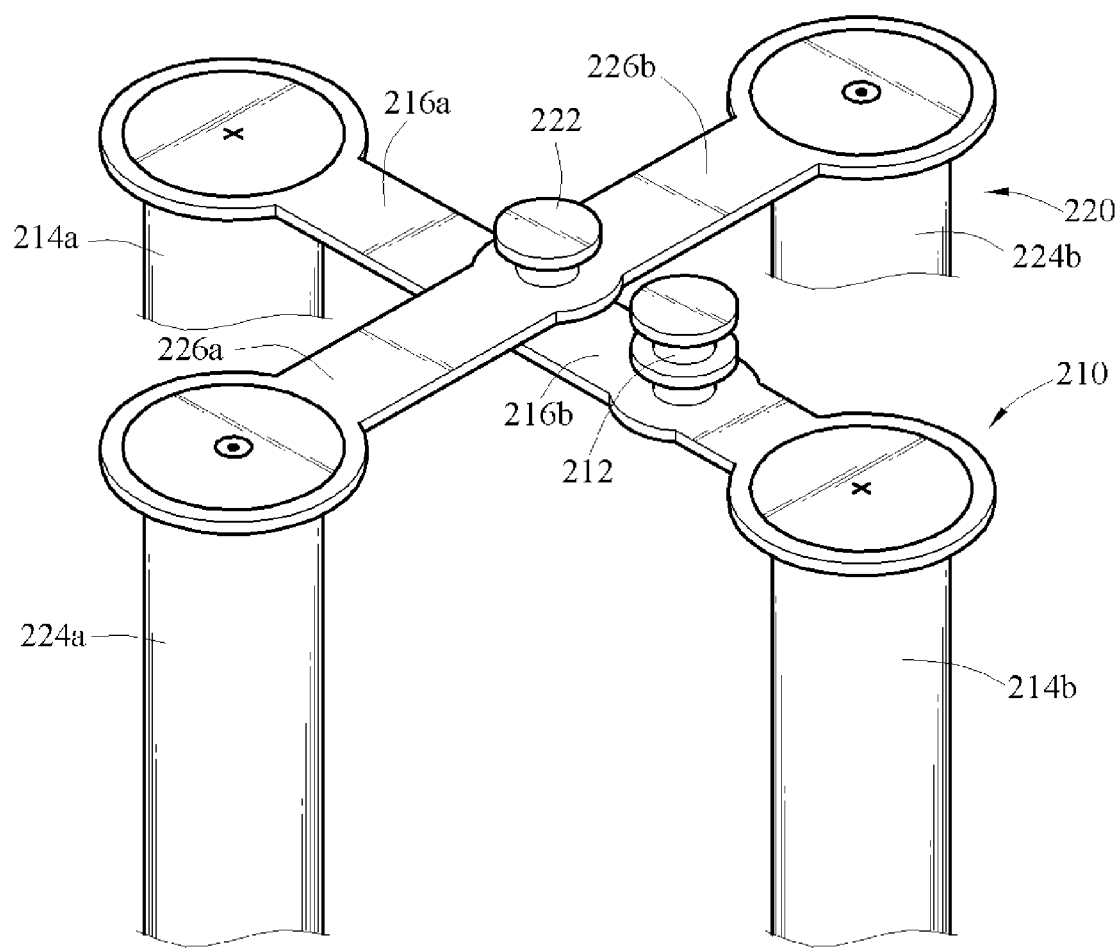
FIG. 6 is a three-dimensional schematic view of the electrically conductive structure according to the first embodiment of the present invention.
Figure 7:
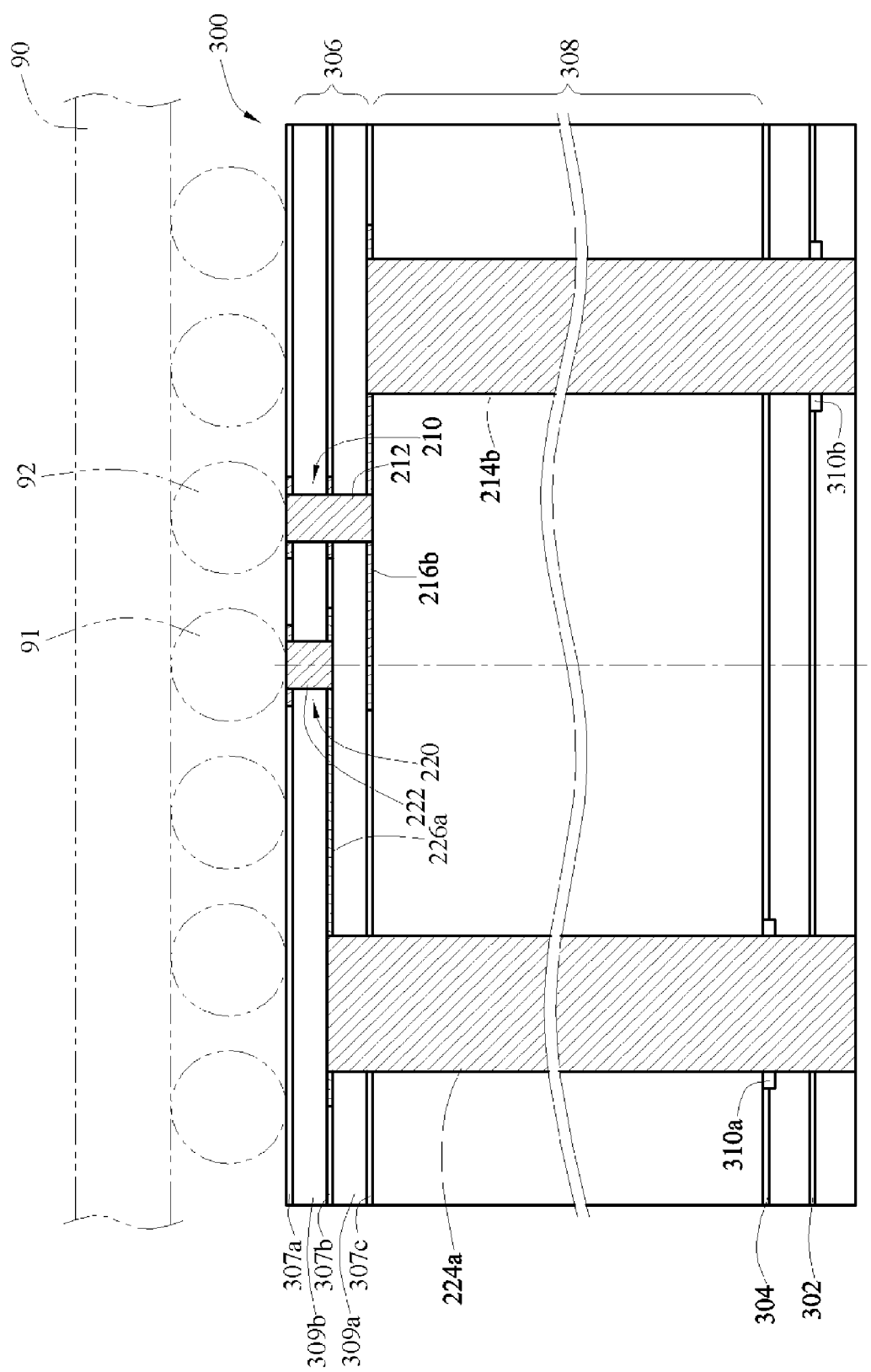
FIG. 7 is a cross-sectional view of the electrically conductive structure disposed in a circuit board according to the first embodiment of the present invention taken along 7-7 line of FIG. 5.

FIGS. 5, 6, and 7 show a schematic structural view of an electrically conductive structure according to a first embodiment of the present invention. FIG. 6 is a three-dimensional structural view of the first embodiment. FIG. 5 is a top view of FIG. 6. FIG. 7 is a structural view of the electrically conductive structure in the first embodiment actually disposed in a circuit board 300, illustrating the cross-section of the first embodiment taken along 7-7 in FIG. 5. The cross-section is taken at an angle of 90° and then is rotated 90° to form a plane.

Referring to FIGS. 5, 6 and 7, through the electrically conductive structure 200 of the first embodiment, at least one power contact 91 and at least one ground contact 92 of the electronic device 90 are electrically coupled to a power plane 302 and a ground plane 304 respectively in the circuit board 300. The electrically conductive structure 200 includes a first conductive structure 220 and a second conductive structure 210. The first conductive structure 220 has a first conducting section 222 electrically coupled to the power contact 91 at one end, and two (extending) first coupling sections 224a, 224b electrically connected to the first conducting section 222 at the other end. The two first coupling sections 224a, 224b are arranged in a pair, and the first coupling sections 224a, 224b are electrically connected to the power plane 302. The second conductive structure 210 has a second conducting section 212 electrically coupled to the ground contact 92 at one end, and two (extending) second coupling sections 214a, 214b electrically connected to the second conducting section 212 at the other end. The two second coupling sections 214a, 214b are arranged in a pair, and the second coupling sections 214a, 214b are electrically connected to the ground plane 304. Two second coupling sections 214a, 214b in a pair and two first coupling sections 224a, 224b in a pair are arranged in a staggered array, as shown in FIGS. 5 and 6.

The staggered array arrangement means that the two first coupling sections 224a, 224b and the two second coupling sections 214a, 214b are arranged in a cross way (observed from the top), and the first coupling sections 224a, 224b and the second coupling sections 214a, 214b are arranged in an array, for example, a 2×2 array in FIG. 5. This arrangement and electrical connecting method enable the first coupling sections 224a, 224b have the same polarity, e.g., a power polarity in the first embodiment (i.e., positive polarity). The second coupling sections 214a, 214b have a ground polarity (i.e., negative polarity). After the first and second coupling sections are arranged in the staggered array, the distance between the coupling sections of the same polarity is longer than the distance between the coupling sections of the opposite polarity. For example, the distance between the first coupling section 224a and the second coupling sections 214a, 214b is shorter than that between the first coupling sections 224a, 224b. Since the two adjacent current loops having opposite current directions may be formed, the magnetic flux between the two current loops are cancelled due to the opposite directions, such that the high-frequency (over the resonance frequency of the capacitor) parasitic inductance of the multilayer planar capacitor is reduced. When the embodiments are applied to the planar capacitor embedded in the PCB, the decoupling bandwidth may be increased, thereby providing a stable power supply system for the high-speed electronic device.

The principle of the magnetic flux cancellation due to the opposite directions is illustrated as follows.

Based on the Ampere's circuital Law $\oint_C \vec{B} \cdot \vec{dl} = \mu_0 \int_s \vec{J} \cdot \vec{ds}$ where, $\vec{B}$ is the magnetic flux, C is the closed curve, $\mu_0$ is the permeability in vacuum, and $\vec{J}$ is the current intensity in the surface S surrounded by the closed curve, when a time-variant current passes through a metal conductive loop, the magnetic flux having a direction determined by Ampere's right-hand rule is produced. When the two wire loops have opposite current directions, the magnetic fluxes produced by the two wire loops are cancelled due to the opposite directions of the magnetic flux. Referring to FIG. 5, since the first coupling sections 224a, 224b are connected to the power plane 302, the current flows out of the paper (which is indicated by marking a dot at the center of a circle). The second coupling sections 214a, 214b are connected to the ground plane 304, so the current flows vertically into the paper (which is indicated by marking a "x" at the center of a circle). Since the distance between the first coupling section 224a and the second coupling sections 214a, 214b is shorter than that between the first coupling sections 224a, 224b, a first current loop 230 and a first magnetic flux 232 are formed between the first coupling section 224a and the second coupling section 214b as shown in FIG. 5. The first magnetic flux 232 is in a direction toward the center of the electrically conductive structure 200, i.e., toward the first conducting section 222. Likewise, a second current loop 234 and a second magnetic flux 236 are formed between the first coupling section 224b and the second coupling section 214a. The second magnetic flux 236 is in a direction toward the center of the electrically conductive structure 200. Accordingly, the first magnetic flux 232 and the second magnetic flux 236 are cancelled due to the opposite magnetic flux directions.

The self-inductance of the metal wire loop is in proportion to the magnetic flux ($L=\phi/I$) produced by the current thereof, where, L is the self-inductance, I is the current, $\Phi$ is the magnetic flux. Thus, the total magnetic flux is reduced with the design of the coupling section, and the high-frequency parasitic inductance of the embedded capacitor is also reduced. In addition, the impedance of the capacitive substrate is in proportion to the parasitic inductance ($Z \approx jwL$) as the frequency is higher than the resonant frequency of the capacitive substrate. Hence, the low impedance bandwidth of the embedded decoupling capacitor is increased, thereby providing a stable power supply system for the high-speed electronic device 90.

The first conductive structure 220 includes the first conducting section 222 and the plurality of first coupling section 224a, 224b. The first coupling section 224a, 224b are electrically connected to the conducting section 222 in the following manner. Referring to the application FIG. 7, the circuit board 300 includes a wiring layer 306, a core layer 308, a ground plane 304 and a power plane 302. The wiring layer 306 includes a plurality of wiring planes, i.e., two or more wiring planes. In this embodiment, three wiring planes 307a, 307b, 307c are described for illustration. The first conducting section 222 and the first coupling sections 224a, 224b are arranged in the wiring layer through the metal trace, such as the first extending section 226a, 226b.

Moreover, the first conducting section 222 and the first coupling sections 224a, 224b may be formed in several methods, and only one common method is described for illustration. Referring to FIG. 7, the circuit board 300 is firstly formed with a power plane 302, a ground plane 304, and a dielectric layer which is arranged between the power plane 302 and the ground plane 304. Then a hole is opened at an appropriate position on the ground plane 304 and filled with the dielectric material to be an isolated-ring 310a. The size of the isolated-ring 310a is greater than the diameter of the first coupling section 224a. Likewise, when the power plane 302 is formed, an isolated-ring 310b is disposed at a position corresponding to the second coupling section 214b, and the size of the isolated-ring 310b is greater than the diameter of the first coupling section 214b, such that the first coupling section 224a is electrically connected to the power plane 302, and the second coupling section 214b is electrically connected to the ground plane 304.

Then, a core layer 308 is fabricated above the ground plane 304 by a PCB process (e.g., a build-up process). A second extending section 216b is fabricated on a wiring plane 307c above the core layer 308. Afterwards, a perforation of the second coupling section 214b is formed. Then, the second coupling section 214b (also referred to as ground-via or ground via-hole) is formed by electroplating or electroless plating, such that the second extending section 216b is electrically connected to the ground plane 304.

After that, a dielectric layer 309a is fabricated by the PCB process, a first extending section 226a is fabricated on the wiring plane 307b above the dielectric layer 309a, and then the first coupling section 224a (also referred to as power-via or power via-hole) is formed by use of the above method, such that the first extending section 226a is electrically connected to the power plane 302. Then, the first conducting section 222 and the second conducting section 212 are formed on the wiring plane 307a above the dielectric layer 309b by the above method. Therefore, the first conducting section 222 is electrically connected to the power plane 302 through the first extending section 226a and the first coupling section 224a, and the second conducting section 212 is electrically connected to the ground plane 304 through the second extending section 216b and the second coupling section 214b.

The extending and connected method between the first conducting section 222 and the first coupling sections 224a, 224b may be known from the above process. Referring to FIGS. 6 and 7, the first coupling sections 224a, 224b are electrically connected to the first conducting section 222 through the plurality of first extending sections 226a, 226b. The first extending sections 226a, 226b are located on the wiring plane 307b of the circuit board 300. The wiring plane 307b may also have other lines required by the PCB, which are not shown in FIG. 7.

Based on the above description, the second extending sections 216a, 216b are disposed between the second conducting section 212 and the second coupling sections 214a, 214b. the second extending sections 216a, 216b are located on the wiring plane 307c, which is different from the wiring plane 307b where the first extending sections 226a, 226b are located. Thus, the first extending sections 226a, 226b and the second extending sections 216a, 216b are respectively located on different wiring planes 307b and 307c in the wiring layer 306 (i.e., in different layers in the wiring layer 306). The first extending sections 226a, 226b and the second extending sections 216a, 216b are marked with two numerals in the specification. However, it can be known from the above illustration of the process that, the first extending sections 226a, 226b and the second extending sections 216a, 216b are one wiring, instead of two elements.

The circuit board using the electrically conductive structure 200 of the present invention may be a common PCB or an integrated circuit (IC) substrate. Through the electrically conductive structure 200, the ground contact and the power contact of the electronic device on the PCB or IC substrate are electrically connected to the negative and positive contacts of the capacitor embedded in the PCB or IC substrate, respectively. In addition, the ground contact and the power contact of the electronic device on the PCB or IC substrate are also electrically connected to the ground plane and the power plane in the PCB or IC substrate, respectively.

Figure 8:
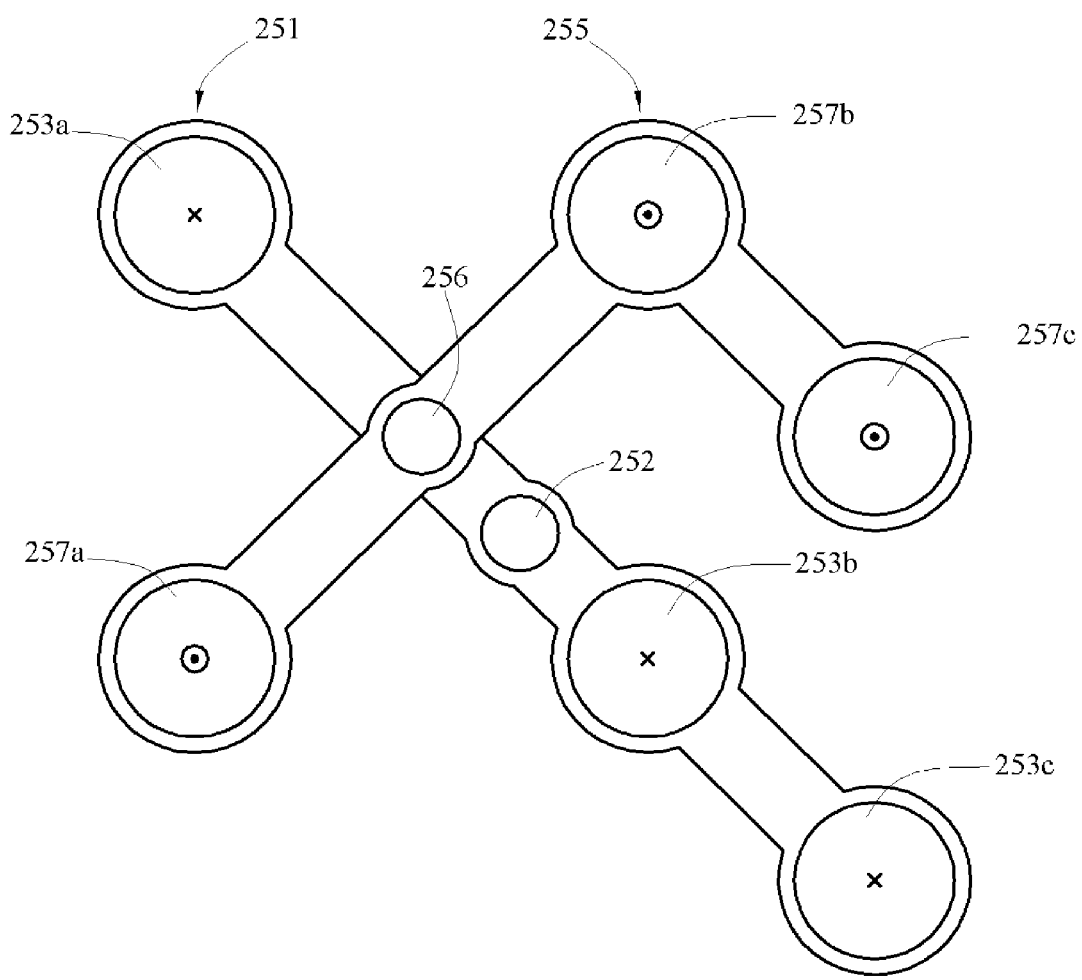
FIG. 8 is a top view of an electrically conductive structure according to a second embodiment of the present invention.

FIG. 8 is a top view of the electrically conductive structure according to a second embodiment. Referring to FIG. 8, the electrically conductive structure 250 includes a first conductive structure 251 and a second conductive structure 255. The first conductive structure 251 has one first conducting section 252 and three first coupling sections 253a, 253b, 253c. The second conductive structure 255 has one second conducting section 256 and three second coupling sections 257a, 257b, 257c. The two first coupling sections 253a, 253b are arranged in pair, and the two second coupling sections 257a, 257b are also arranged in a pair. The two first coupling sections 253a, 253b in a pair and the two second coupling sections 257a, 257b in a pair are arranged in a staggered array, such that the effect of the magnetic flux cancellation may be achieved. The arrangement of the first coupling section 253c and the second coupling section 257c is not in a pair and not limited to that as shown in FIG. 8, and may be achieved in any manner.

Figure 9:
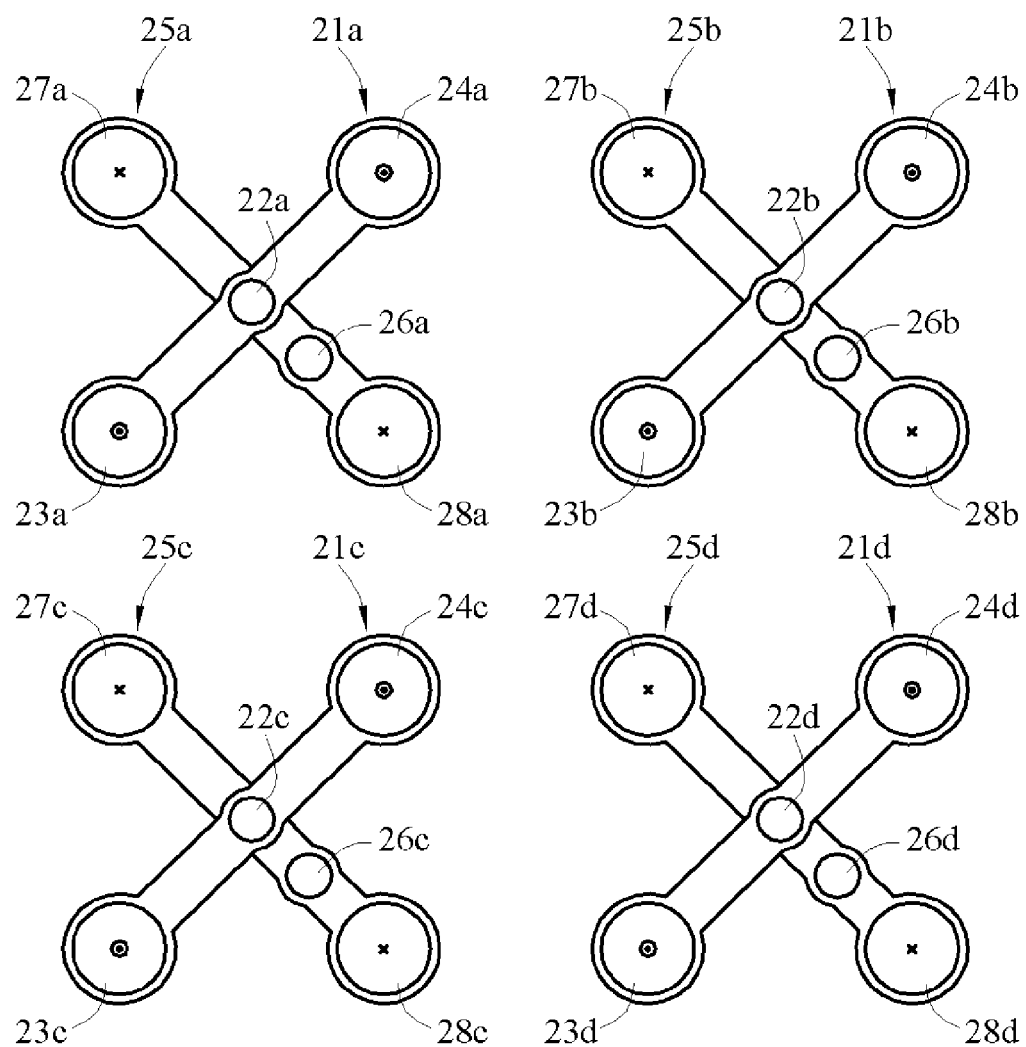
FIG. 9 is a top view of an electrically conductive structure according to a third embodiment of the present invention.

FIG. 9 shows the electrically conductive structure according to a third embodiment of the present invention, which is applied in an electronic device having four power contacts and four ground contacts. Referring to FIG. 9, the electrically conductive structure 20 comprise four first conductive structures 21a, 21b, 21c, 21d and four second conductive structures 25a, 25b, 25c, 25d. Each first conductive structure 21a, 21b, 21c, 21d has one first conducting section 22a, 22b, 22c, 22d and two first coupling sections 23a, 24a, 23b, 24b, 23c, 24c, 23d, 24d. Each second conductive structure 25a, 25b, 25c, 25d also has one second conducting section 26a, 26b, 26c, 26d and two second coupling sections 27a, 28a, 27b, 28b, 27c, 28c, 27d, 28d. The four first conductive structures 21a, 21b, 21c, 21d and four second conductive structures 25a, 25b, 25c, 25d are not electrically connected. Actually, the four first conductive structures 21a, 21b, 21c, 21d are used to electrically connect the four power contacts of the electronic device to the power plane of the PCB or IC substrate. The four second conductive structures 25a, 25b, 25c, 25d are used to electrically connect the four ground contacts of the electronic device to the ground plane of the PCB or IC substrate. However, in this embodiment, the four first conductive structures 21a, 21b, 21c, 21d and the four second conductive structures 25a, 25b, 25c, 25d are not electrically connected to each other, but respectively electrically connected to the power contact and the ground contact of the embedded capacitor or the power plane and the ground plane of the PCB or IC substrate.

Figure 10:
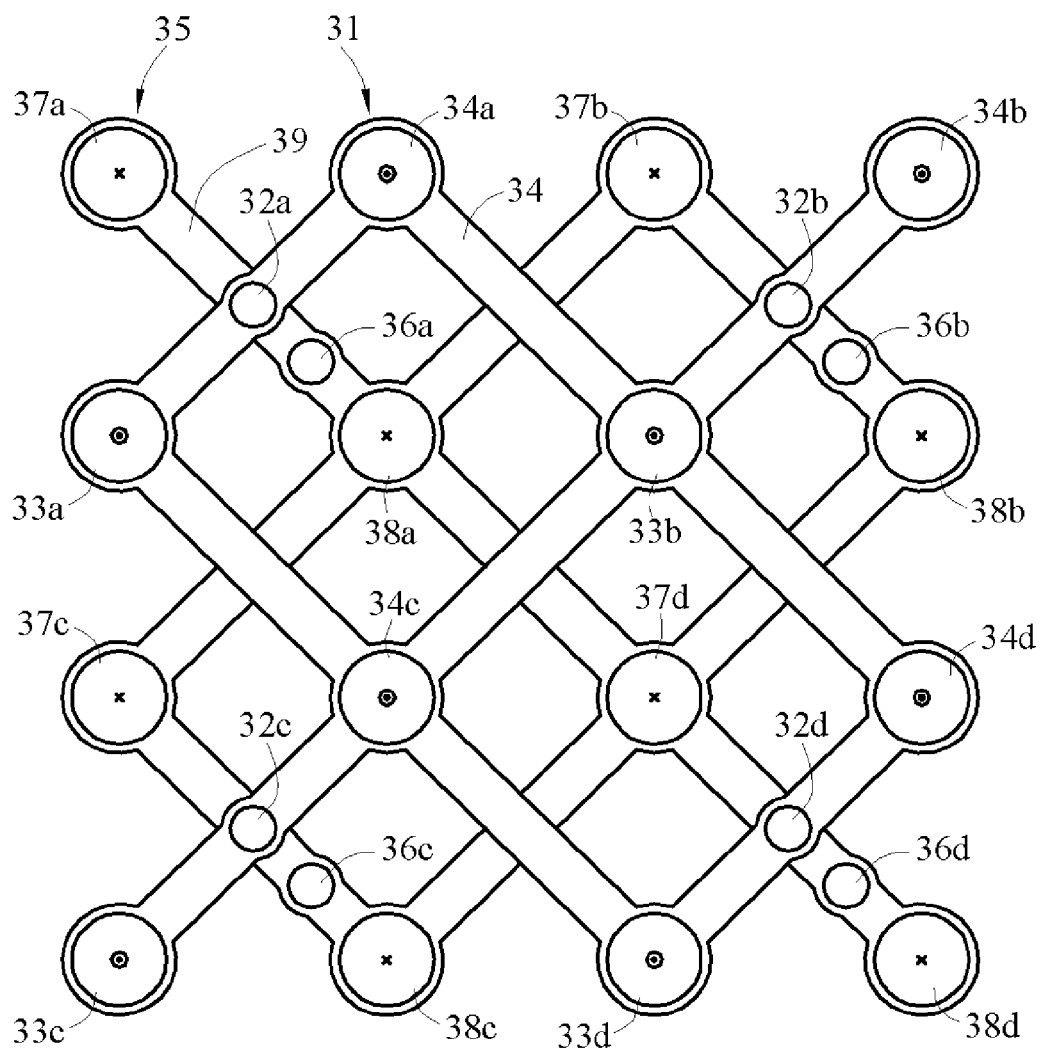
FIG. 10 is a top view of an electrically conductive structure according to a fourth embodiment of the present invention.

FIG. 10 is a top view of the electrically conductive structure according to a fourth embodiment. The embodiment is also applied in the electronic device having four power contacts and four ground contacts, which is the same as the electronic device applied to FIG. 9. However, the structure in this embodiment slightly differs from the third embodiment. Referring to FIG. 10, the electrically conductive structure 30 consists of one first conductive structure 31 and one second conductive structure 35. The first conductive structure 31 has four first conducting sections 32a, 32b, 32c, 32d and eight first coupling sections 33a, 34a, 33b, 34b, 33c, 34c, 33d, 34d. The second conductive structure 35 also has four second conducting sections 36a, 36b, 36c, 36d and eight second coupling sections 37a, 38a, 37b, 38b, 37c, 38c, 37d, 38d. The fourth embodiment and the third embodiment have the same number of the conducting sections and the coupling sections. But in the fourth embodiment, the first conducting section 32a, 32b, 32c, 32d are electrically connected to the first coupling sections 33a, 34a, 33b, 34b, 33c, 34c, 33d, 34d through the first extending section 34 therebetween. Likewise, the second conducting sections 36a, 36b, 36c, 36d are also electrically connected to the second coupling sections 37a, 38a, 37b, 38b, 37c, 38c, 37d, 38d through the second extending sections 39 therebetween. The structure of the present invention not only has the effects of reducing the impedance, but also has the effect of a plurality of capacitors connected in parallel, such that the overall parasitic inductance of the embedded capacitor is further reduced. In other words, the low impedance bandwidth of the embedded capacitor will be further increased.

The comparison between the third and the fourth embodiments (FIGS. 9 and 10) shows that both of them are applied to the electronic device having four power contacts and four ground contacts. However, in the third embodiment, one power contact and one ground contact are electrically connected to the power plane and the ground plane respectively in the manner disclosed in the first embodiment. In the fourth embodiment, the four power contacts of the electronic device are electrically connected to the four first conducting sections 32a, 32b, 32c, 32d and then connected to the first coupling sections 33a, 34a, 33b, 34b, 33c, 34c, 33d, 34d through the first extending section 34. Similarly, the four ground contacts are electrically connected to the second conducting sections 36a, 36b, 36c, 36d, and then connected to the second coupling sections 37a, 38a, 37b, 38b, 37c, 38c, 37d, 38d through the second extending section 39.

Figure 11:
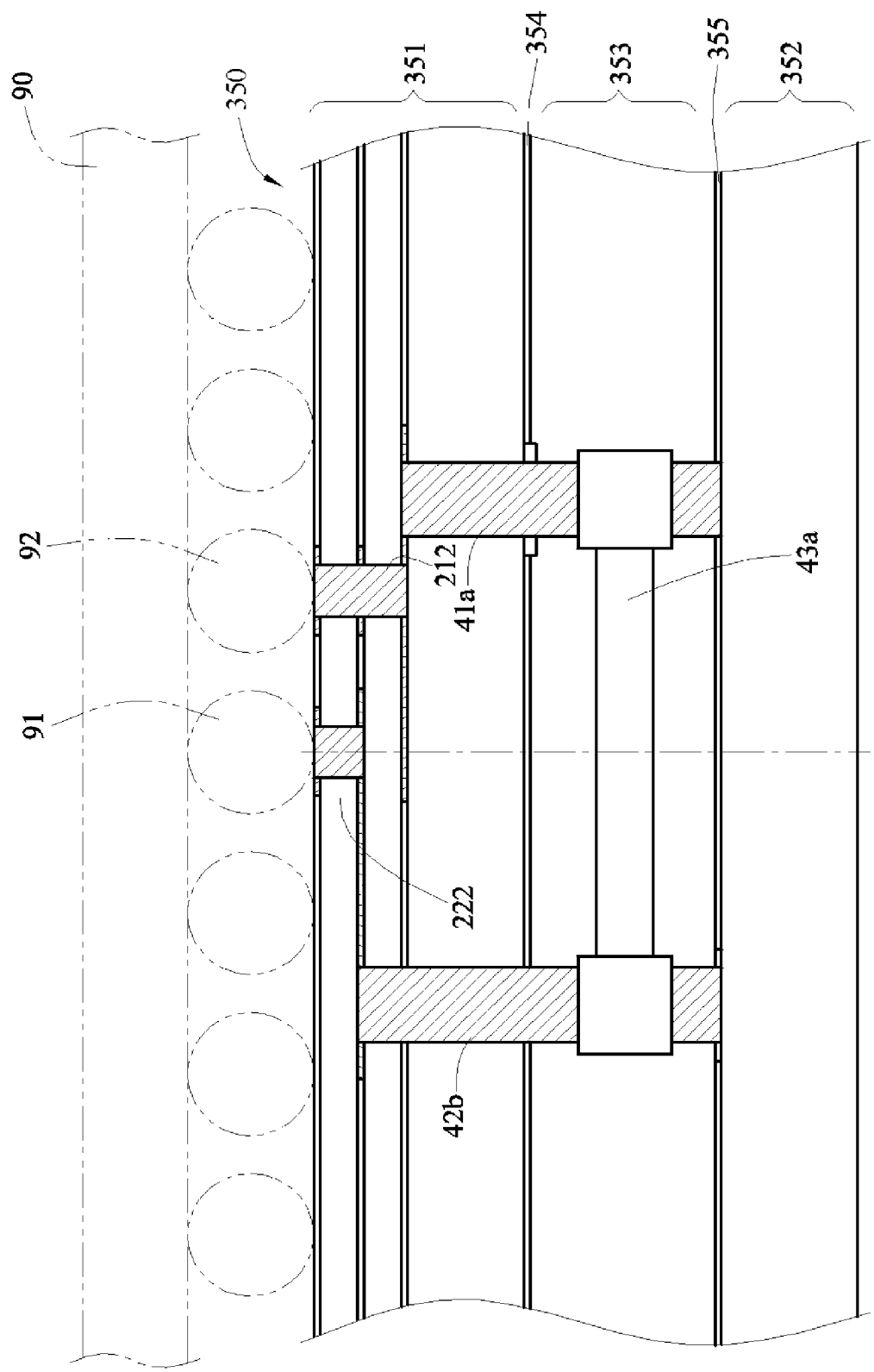
FIG. 11 is a cross-sectional view of an electrically conductive structure according to a fifth embodiment of the present invention illustrating the same cross-section as that in FIG. 7.

FIG. 11 is the cross-sectional view of the electrically conductive structure according to a fifth embodiment of the present invention illustrating the same cross-section as that in FIG. 7. In FIG. 11, only one first coupling section 41a and one second coupling section 42b are depicted. The circuit board 350 applied in the fifth embodiment differs from the circuit board 300 in FIG. 7. The circuit board 350 carries the electronic device 90 on a first wiring layer 351. A power layer 354 (i.e., the power plane), a core layer 353, a ground layer 355 (i.e., the ground plane), and a second wiring layer 352 are stacked below the first wiring layer 351. The first wiring layer 351 and the second wiring layer 352 are similar to the wiring layer 306 in FIG. 7, and all of them consist of a plurality of wiring planes and dielectric layers sandwiched between the wiring planes. The electrically conductive structure is arranged at the first wiring layer 351 and is electrically connected to the power layer 354 and the ground layer 355 respectively. Through the electrically conductive structure, the power contact 91 and the ground contact 92 of the electronic device 90 are electrically connected to the power layer 354 and the ground layer 355, respectively.

In this embodiment, an discrete capacitor 43a (such as an SMD capacitor or a chip capacitor) embedded in the core layer 353 of the circuit board 350 is disposed between the first coupling section 41a and the second coupling section 42b and is electrically connected to power contact 91 and the ground contact 92. Moreover, in this embodiment, another discrete capacitor may be disposed between the first coupling section 41a and the second coupling section 42b, and is also electrically connected to power contact 91 and the ground contact 92, which can not be seen from the cross-sectional view of this embodiment. The cross-sectional view of FIG. 11 can only show one discrete capacitor 43a. Besides, through the electrically conductive structure disclosed from the present invention, the discrete capacitor 43a may be electrically connected to the power contact 91 and the ground contact 92 of the electronic device 90 to increase the decoupling bandwidth of the discrete capacitor 43a and provide a stable power delivery system. The discrete capacitor 43a embedded in the circuit board 350 in this embodiment may also be an planar capacitor 44 embedded in the circuit board 350 as shown in FIG. 12 (the sixth embodiment), which also has the function of stabilizing the power delivery system.

Figure 12:
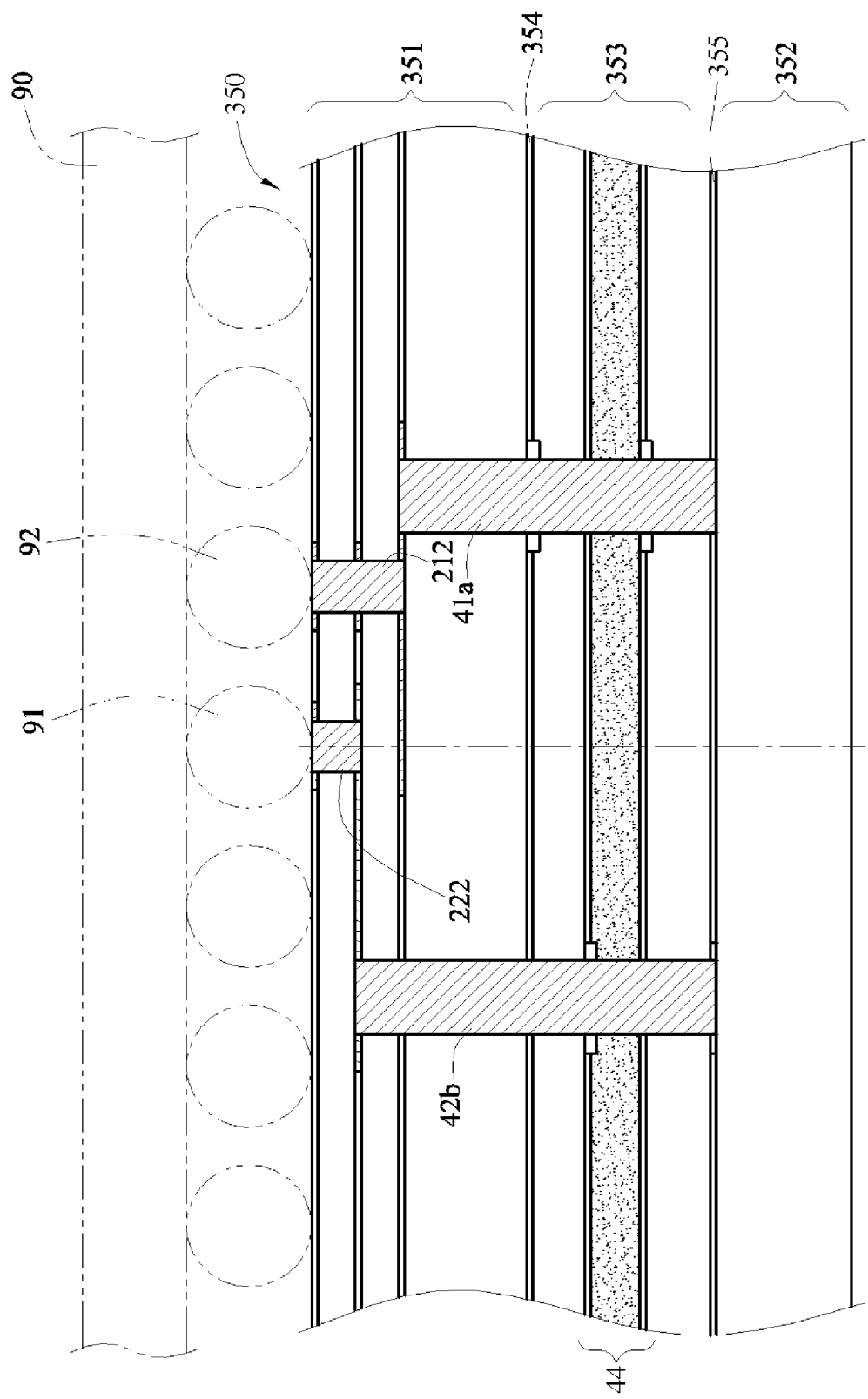
FIG. 12 is a cross-sectional view of an electrically conductive structure according to a sixth embodiment of the present invention illustrating the same cross-section as that in FIG. 7.
Figure 13:
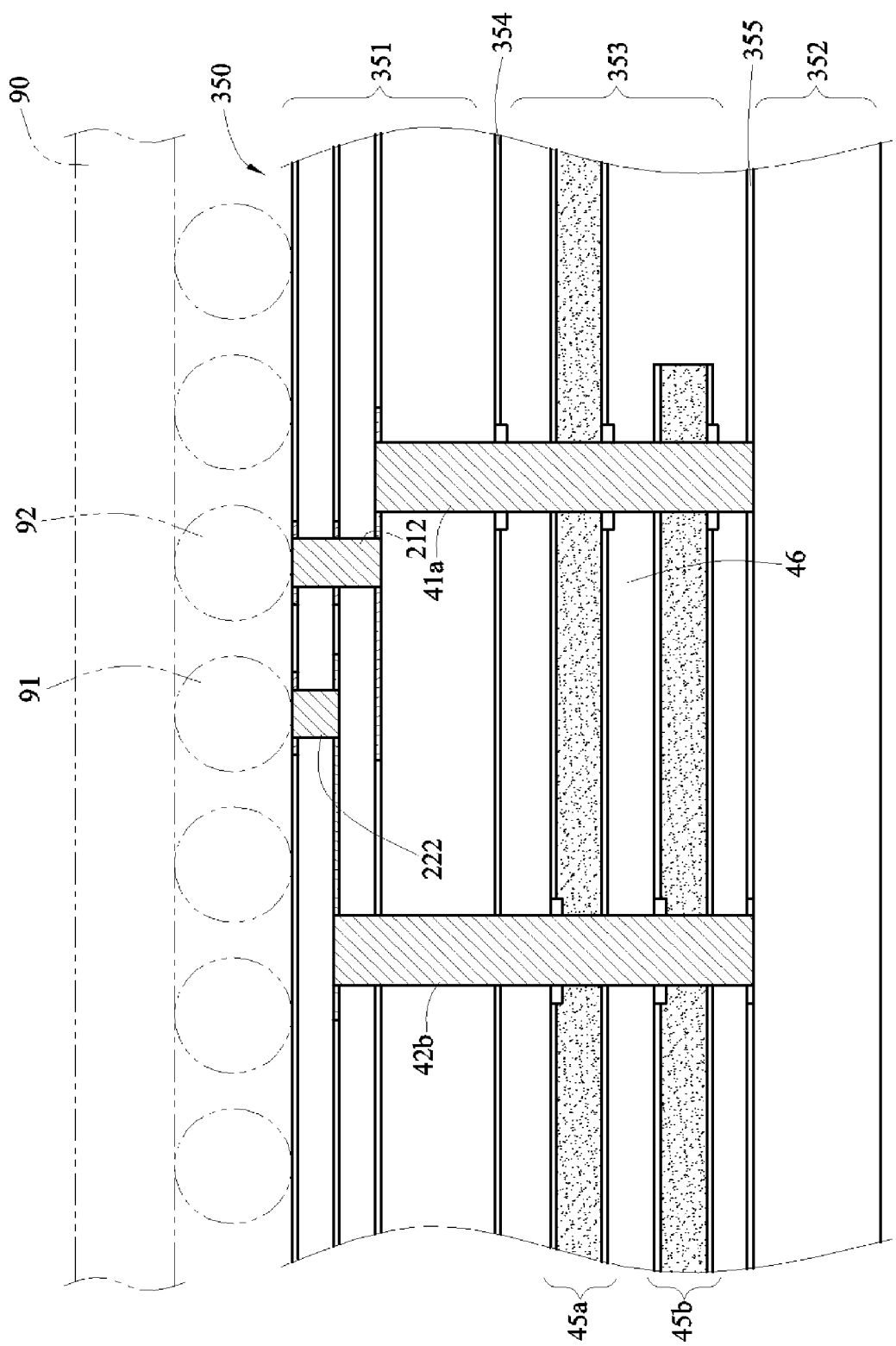
FIG. 13 is a cross-sectional view of an electrically conductive structure according to a seventh embodiment of the present invention illustrating the same cross-section as that in FIG. 7.

FIG. 13 shows the electrically conductive structure according to a seventh embodiment of the present invention, which has a main structure identical with FIG. 12. Two planar capacitors, including a first planar capacitor 45a and a second planar capacitor 45b, embedded in the core layer 353 of the circuit board 350 are applied in this embodiment. The block clamped between the two planar capacitors 45a and 45b is a dielectric layer 46, which may also form another capacitor in structure. The first coupling section 41a is electrically connected to the first electrode of the first planar capacitor 45a and the second planar capacitor 45b. The second coupling section 42b is electrically connected to the second electrode of the first planar capacitor 45a and the second planar capacitor 45b. The two capacitor having different capacitances are electrically connected to the electrically conductive structure of the present invention, thus achieving a higher low impedance bandwidth at the first conducting section 222 and the second conducting section 212 (i.e., the power pin or ground pin of the electronic device). Through two planar capacitors 45a, 45b are embedded in this embodiment, more than two planar capacitors having different capacitances may be embedded as required in another application.

The electrically conductive structure of the present invention electrically connected the decoupling capacitor can solve the problem that the parasitic inductance effect aggravates as the switching frequency of the electronic device is higher than the self-resonant frequency of the decoupling capacitor, which will be illustrated as follows.

Figure 1:
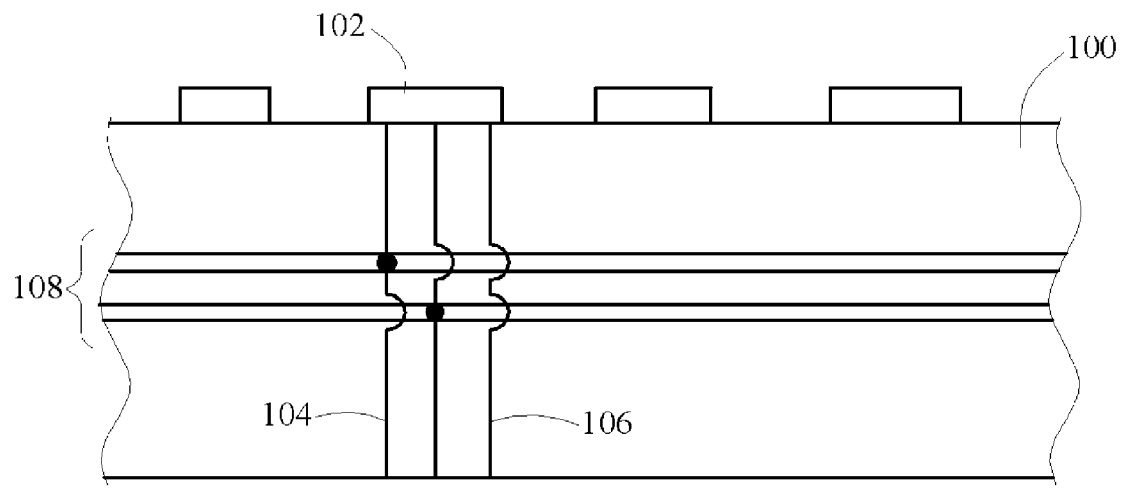
FIG. 1 is a schematic view of a conventional electrically conductive structure in a circuit board.
Figure 2:
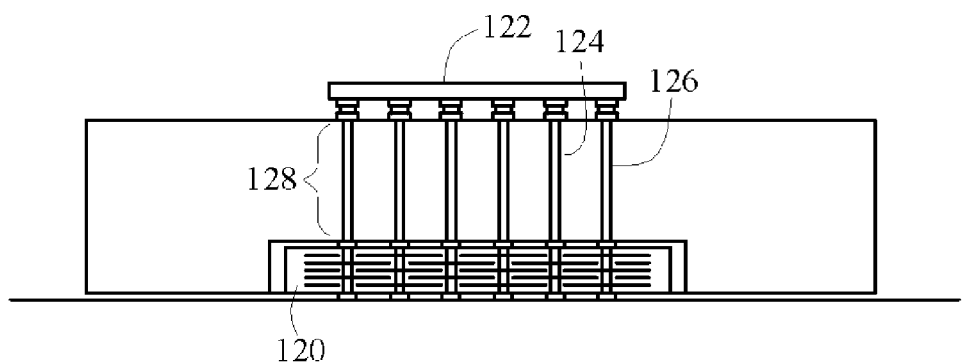
FIG. 2 is a schematic view of another conventional electrically conductive structure in a circuit board.
Figure 3:
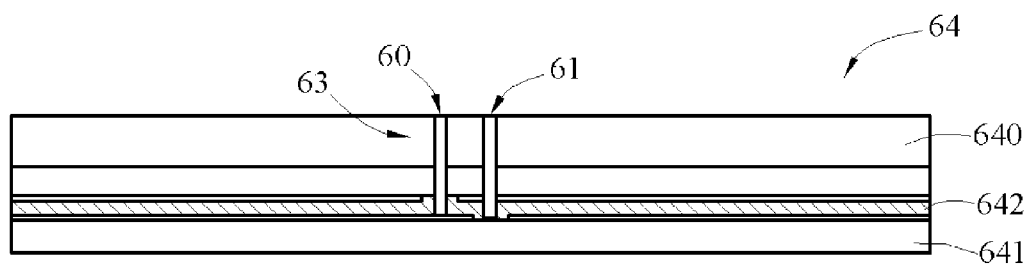
FIG. 3 is a schematic structural view of a conventional electrically conductive structure in a circuit board.
Figure 14:
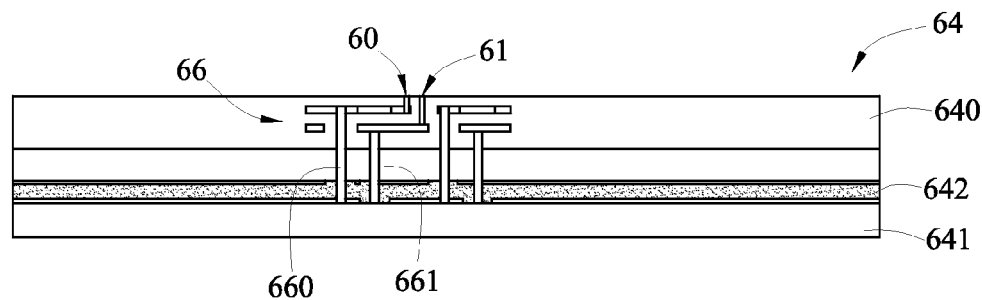
FIG. 14 is a structural view of the electrically conductive structure of the present invention applied to FIG. 3 of the conventional art.

Referring to FIGS. 3 and 14, FIG. 3 shows a conventional electrically conductive structure 63 (also referred to as a metal conductive structure) of the circuit board 64. The circuit board 64 consists of a wiring layer 640 and a core layer 641. The planar capacitor 642 may be embedded in the core layer 641. The arrows 60, 61 are the measured points by test probes. That is, the position of the arrows 60, 61 may be welded with the power contact and the ground contact of the electronic device. The distance between two spots of the arrows 60, 61 is 10 mil. FIG. 14 is the same as the FIG. 3, except that the design of the electrically conductive structure 66 in the present invention is adopted. The distance between the first coupling section 660 and the second coupling section 661 is also 10 mil corresponding to that of FIG. 3.

Figure 15:
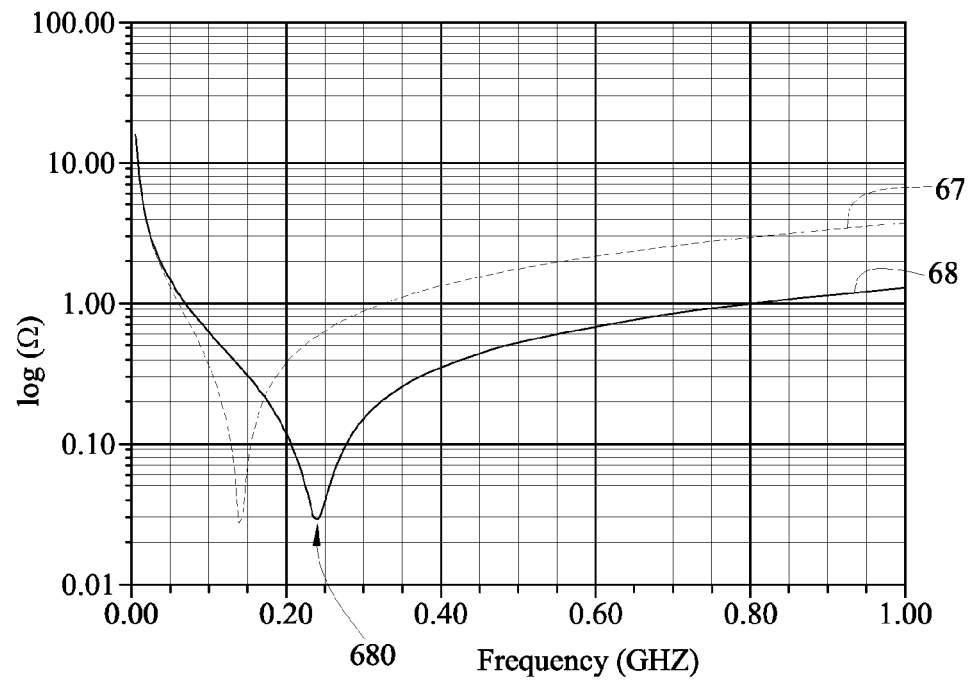
FIG. 15 is a diagram illustrating an impedance simulation result of the structure in FIGS. 3 and 14.

After simulating by a high frequency software, referring to FIG. 15, the horizontal axis is the frequency ranging from 0 Hz to 1G Hz, and the longitudinal axis is the impedance ranging from 0.01 Ω to 100 Ω. Referring to FIG. 15, the curve 67 represents the impedance characteristic of the conventional structure shown in FIG. 3, and the curve 68 represents the impedance characteristic of the structure shown in FIG. 14. The self-resonant frequency 680 of the structure shown in FIG. 14 is higher than that of the structure shown in FIG. 3. Moreover, as the frequency is at 1 GHz, the impedance of the conventional structure shown in FIG. 3 is 3.72 ohm and the impedance of the structure shown in FIG. 14 of the present invention is only 1.29 ohm. The impedance is reduced by about ⅓, thereby proving that the structure of the present invention has a preferred effect in reducing the high-frequency impedance of the capacitor embedded in the circuit board.

Figure 4:
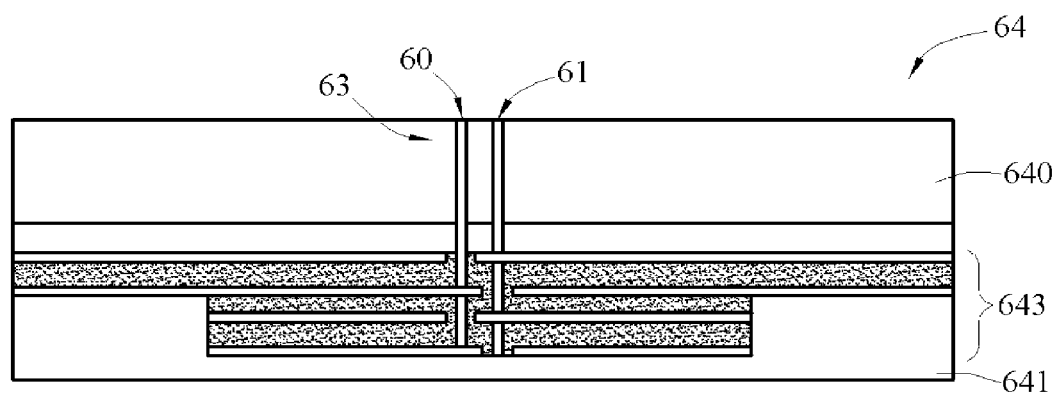
FIG. 4 is a schematic structural view of the conventional electrically conductive structure in a circuit board.
Figure 16:
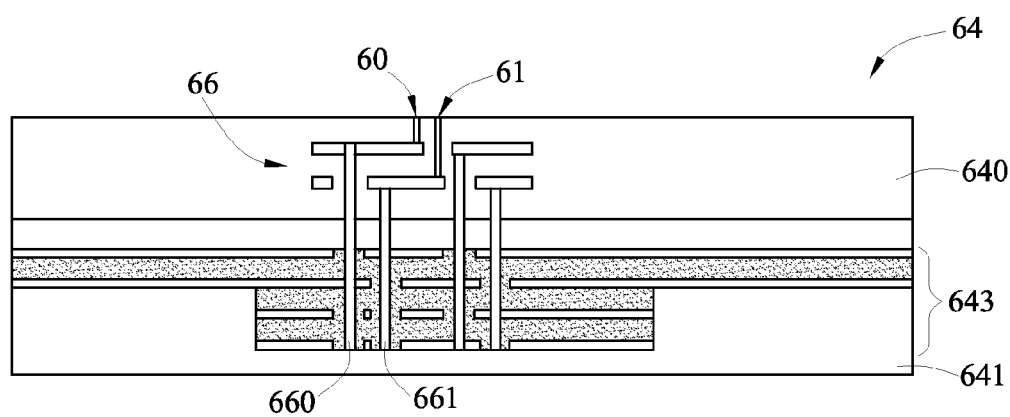
FIG. 16 is a schematic structural view of the electrically conductive structure of the present invention applied to FIG. 4.

Then referring to FIGS. 4 and 16, FIG. 4 is a conventional electrically conductive structure 63 (also referred to as the metal conductive structure) of the circuit board 64. The circuit board 64 consists of a wiring layer 640 and a core layer 641. The four-layer planar capacitor 643 may be embedded in the core layer 641. The position of the arrows 60, 61 may be welded with the power contact and the ground contact of the electronic device. The distance between two spots of the arrows 60, 61 is 10 mil. FIG. 16 is the same as FIG. 4, except that the electrically conductive structure 66 is designed according to the present invention. The distance between the first coupling section 660 and the second coupling section 661 is 10 mil, in correspondence to FIG. 4.

Figure 17:
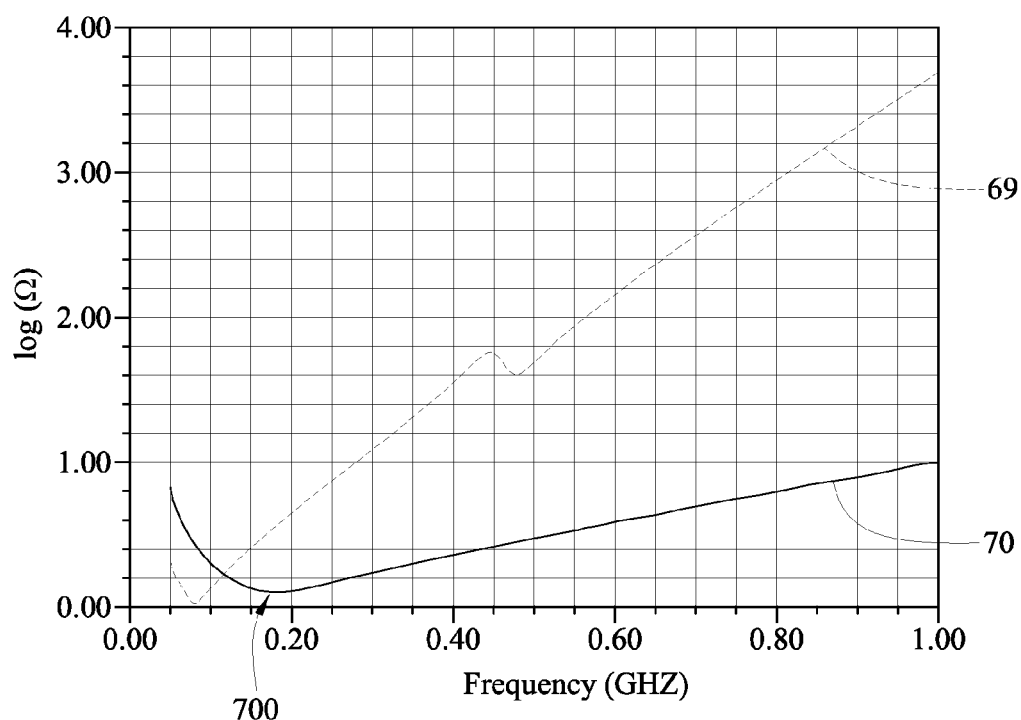
FIG. 17 is a diagram illustrating an impedance simulation result of the structure in FIGS. 4 and 16.

After simulating by a high frequency software, referring to FIG. 17, the horizontal axis is the frequency ranging from 0 Hz to 1 G Hz, and the longitudinal axis is the impedance ranging from 0.01 Ω to 100 Ω. Referring to FIG. 17, the curve 69 represents the impedance characteristic of the conventional structure shown in FIG. 4, and the curve 70 represents the impedance characteristic of the structure shown in FIG. 16 of the present invention. The self-resonant frequency 700 of the curve 70 is higher than that of the curve 69. Moveover, as the frequency is at 1 GHz, the impedance of the curve 69 is 3.67 ohm and the impedance of the curve 70 is only approximately 1 ohm. In other words, when the frequency is 1 GHz, the impedance in FIG. 17 is reduced by about ⅓ of that in FIG. 4, thereby having a better decoupling effect.

What is claimed is:

1. An electrically conductive structure of a circuit board, for electrically connecting at least one power contact and at least one ground contact of an electronic device to a power plane and a ground plane of the circuit board, respectively, the electrically conductive structure comprising:

at least one first conductive structure, having at least one first conducting section electrically connected to the at least one power contact at one end and a plurality of first coupling sections electrically connected to the at least one first conducting section at another end, wherein two first coupling sections of the plurality of first coupling sections are arranged in a pair, and the plurality of first coupling sections are electrically connected to the power plane; and at least one second conductive structure, having at least one second conducting section electrically connected to the at least one ground contact at one end, and a plurality of second coupling sections electrically connected to the at least one second conducting section at another end, wherein two second coupling sections of the plurality of second coupling sections are arranged in a pair, the plurality of second coupling sections are electrically connected to the ground plane, and the pair of the two second coupling sections and the pair of the two first coupling sections are arranged in a staggered array.

2. The electrically conductive structure as claimed in claim 1, wherein the number of the at least one power contact is one, the number of the at least one ground contact is one, the number of the at least one first conductive structure is one, the number of the at least one second conductive structure is one, the number of the at least one first conducting section is one, the number of the plurality of first coupling sections is two, the number of the at least one second conducting section is one, and the number of the plurality of second coupling sections is two.

3. The electrically conductive structure as claimed in claim 1, wherein the number of the at least one power contact is one, the number of the at least one ground contact is one, the number of the at least one first conductive structure is one, the number of the at least one second conductive structure is one, the number of the at least one first conducting section is one, the number of the plurality of first coupling sections is three, the number of the at least one second conducting section is one, and the number of the plurality of second coupling sections is three.

4. The electrically conductive structure as claimed in claim 1, wherein the number of the at least one power contact is four, the number of the at least one ground contact is four, the number of the at least one first conductive structure is four, the number of the at least one second conductive structure is four, the number of the at least one first conducting section in each of the four first conductive structures is one, the number of the plurality of first coupling sections in each of the four first conductive structures is two, and the number of the at least one second conducting section in each of the four second conductive structures is one, and the number of the plurality of second coupling sections in each of the four second conductive structures is two.

5. The electrically conductive structure as claimed in claim 1, wherein the number of the at least one power contact is four, the number of the at least one ground contact is four, the number of the at least one first conductive structure is one, the number of the at least one second conductive structure is one, the number of the at least one first conducting section is four, the number of the plurality of first coupling sections is eight, the number of the at least one second conducting section is four, and the number of the plurality of second coupling sections is eight.

6. The electrically conductive structure as claimed in claim 1, wherein the plurality of first coupling sections are electrically connected with the at least one first conducting section through a plurality of first extending sections, and the plurality of second coupling sections are electrically connected with the at least one second conducting section through a plurality of second extending sections.

7. The electrically conductive structure as claimed in claim 6, wherein the plurality of first extending sections and the plurality of second extending sections are respectively located on different wiring layers of the circuit board.

8. The electrically conductive structure as claimed in claim 1, wherein at least one discrete capacitor is electrically connected between the plurality of first coupling sections and the plurality of second coupling sections.

9. The electrically conductive structure as claimed in claim 8, wherein the at least one discrete capacitor is a surface mount device capacitor or a chip capacitor.

10. The electrically conductive structure as claimed in claim 8, wherein the at least one discrete capacitor is a planar capacitor.

11. The electrically conductive structure as claimed in claim 8, wherein the number of the at least one discrete capacitor is two or more, and the two or more discrete capacitors are planar capacitors.

12. A circuit board having an electrically conductive structure, wherein an electronic device having at least one power contact and at least one ground contact is disposed on the circuit board, the circuit board comprising:
a power plane;
a ground plane;
at least one first conductive structure, having at least one first conducting section electrically connected to the at least one power contact at one end, and a plurality of first coupling sections electrically connected to the at least one first conducting section at another end, wherein two first coupling sections of the plurality of first coupling sections are arranged in a pair and are electrically connected to the power plane; and
at least one second conductive structure, having at least one second conducting section electrically connected to the at least one ground contact at one end, and a plurality of second coupling sections electrically connected to the at least one second conducting section at another end, wherein two second coupling sections of the plurality of second coupling sections are arranged in a pair and electrically connected to the ground plane, and the pair of the two second coupling sections and the pair of the two first coupling sections are arranged in a staggered array.

13. The circuit board as claimed in claim 12, wherein the number of the at least one power contact is one, the number of the at least one ground contact is one, the number of the at least one first conductive structure is one, the number of the at least one second conductive structure is one, the number of the at least one first conducting section is one, the number of the plurality of first coupling sections is two, the number of the at least one second conducting section is one, and the number of the plurality of second coupling sections is two.

14. The circuit board as claimed in claim 12, wherein the plurality of first coupling sections are electrically connected with the at least one first conducting section through a plurality of first extending sections, and the plurality of second coupling sections are electrically connected with the at least one second conducting section through a plurality of second extending sections.

15. The circuit board as claimed in claim 14, wherein the plurality of first extending sections and the plurality of second extending sections are respectively located on different wiring layers of the circuit board.

16. The circuit board as claimed in claim 12, wherein the number of the at least one power contact is one, the number of the at least one ground contact is one, the number of the at least one first conductive structure is one, the number of the at least one second conductive structure is one, the number of the at least one first conducting section is one, the number of the plurality of first coupling sections is three, the number of the at least one second conducting section is one, and the number of the plurality of second coupling sections is three.

17. The circuit board as claimed in claim 12, wherein the number of the at least one power contact is four, the number of the at least one ground contact is four, the number of the at least one first conductive structure is four, the number of the at least one second conductive structure is four, the number of the at least one first conducting section in each of the four first conductive structures is one, the number of the plurality of first coupling sections in each of the four first conductive structures is two, and the number of the at least one second conducting section in each of the four second conductive structures is one, and the number of the plurality of second coupling sections in each of the four second conductive structures is two.

18. The circuit board as claimed in claim 12, wherein the number of the at least one power contact is four, the number of the at least one ground contact is four, the number of the at least one first conductive structure is one, the number of the at least one second conductive structure is one, the number of the at least one first conducting section is four, the number of the plurality of first coupling sections is eight, the number of the at least one second conducting section is four, and the number of the plurality of second coupling sections is eight.

19. The circuit board as claimed in claim 12, wherein at least one discrete capacitor is electrically connected between the plurality of first coupling sections and the plurality of second coupling sections.

20. The circuit board as claimed in claim 19, wherein the at least one discrete capacitor is a surface mount device capacitor or a chip capacitor.

21. The circuit board as claimed in claim 19, wherein the at least one discrete capacitor is a planar capacitor.

22. The circuit board as claimed in claim 19, wherein the number of the at least one discrete capacitor is two or more, and the two or more discrete capacitors are planar capacitors.

* * * * *